United States Patent
Park

(10) Patent No.: US 7,202,714 B2
(45) Date of Patent: Apr. 10, 2007

(54) AMPLIFIER CIRCUIT WITH OUTPUT DELAY SELECTIVELY CHANGED ACCORDING TO COMMON MODE VOLTAGE LEVEL, ASSOCIATED REPLICA DELAY CIRCUIT AND INTERNAL CLOCK GENERATOR

(75) Inventor: Won-Ki Park, SuWon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 281 days.

(21) Appl. No.: 10/824,361

(22) Filed: Apr. 15, 2004

(65) Prior Publication Data
US 2004/0227554 A1    Nov. 18, 2004

(30) Foreign Application Priority Data
May 12, 2003  (KR) ............... 10-2003-0029761
Dec. 5, 2003  (KR) ............... 10-2003-0087990

(51) Int. Cl.
*H03L 7/06* (2006.01)

(52) U.S. Cl. ..................... 327/149; 327/158

(58) Field of Classification Search ............ 327/149, 327/153, 158, 161, 162; 331/17, 25, DIG. 2; 375/373–376
See application file for complete search history.

(56) References Cited

U.S. PATENT DOCUMENTS 6,518,807 B1 * 2/2003 Cho .................. 327/158
6,552,587 B2 * 4/2003 Kim et al. ........... 327/158
6,754,841 B2 * 6/2004 Yang ................. 713/503

* cited by examiner

*Primary Examiner*—Linh My Nguyen
(74) *Attorney, Agent, or Firm*—Volentine & Whitt, PLLC

(57) ABSTRACT

An amplifier circuit having an output delay that is selectively changed in accordance with a common mode voltage level. A replica delay circuit adapted for use within an internal clock generator include such an amplifier circuit. The amplifier circuit includes a first amplifier generating internal signal in response to input signals changes a common mode voltage level of the internal signals in response to control signals. The amplifier also includes a second amplifier comparing voltage levels of the internal signals, generating an output signal in accordance with a comparison result, and changing a duty cycle of the output signal when the common mode voltage level of the internal signals is changed.

13 Claims, 8 Drawing Sheets

US 7,202,714 B2

AMPLIFIER CIRCUIT WITH OUTPUT DELAY SELECTIVELY CHANGED ACCORDING TO COMMON MODE VOLTAGE LEVEL, ASSOCIATED REPLICA DELAY CIRCUIT AND INTERNAL CLOCK GENERATOR

BACKGROUND OF THE INVENTION

1. Field of the Invention

The present invention relates generally to amplifier circuits, and more particularly, the present invention relates to an amplifier circuit that delays a signal.

A claim of priority is made to Korean Patent Application No. 2003-29761 filed May 12, 2003 and No. 2003-87990 filed Dec. 5, 2003 in the Korean Patent Office. Both disclosures are hereby incorporated by reference in their entirety.

2. Description of the Related Art

In general, amplifier circuits receive an input signal, amplify the input signal by a predetermined factor, and thereafter output a resulting amplified signal. A typical, conventional amplifier circuit is shown in FIG. 1. Referring to FIG. 1, a differential amplifier 10 includes load PMOS transistors PM1 and PM2, differential NMOS transistors NM1 and NM2, and a current source NMOS transistor NM3. Differential amplifier 10 outputs an output signal OUT having some predetermined delay with respect to input signals IN and INB. In other words, it takes some predetermined period of time for the output signal OUT to appear at a voltage node NOD once input signals IN and INB are respectively applied to the gates of differential NMOS transistors NM1 and NM2. Since conventional amplifier circuits produce an output signal that is delayed with respect to a corresponding input signal due to the propagation delays inherent in conduction of the signal through the amplifier circuit components, such circuit are often specifically used as delay circuits. However, conventional amplifier circuits are characterized by a fixed delay, and are accordingly difficult to use in circuits requiring a variable or variably controlled delay.

For data transmission between semiconductor memory devices and memory controllers, for example, an input/output (I/O) interface method is conventionally used in which data is transmitted in synchronization with a clock signal having a predetermined frequency. In the context of this I/O interface method, it has become increasingly important to achieve accurate temporal synchronization between the clock signal and data output events. This accurate timing requirement will continue to be an issue as bus transfers and data transmission speeds increase. Thus, in order for data output to be accurately synchronized to a prescribed clock edge or the center of a data output period, the clock signal provided to relevant circuit components must be temporally adjusted (e.g., delayed) in relation to other delays affecting the output of data, such as, for example, the delay inherent in the transfer of data onto a databus. Thus, semiconductor memory devices typically include an internal clock generator that receives an external clock signal and generates an internal clock signal. The internal clock generator may be implemented by a phase locked loop (PLL) or a delay locked loop (DLL). An internal clock generator implemented using a DLL circuit is shown in FIG. 2.

More particularly, FIG. 2 is a block diagram of a conventional internal clock generator and a data output circuit of the type typically included in a semiconductor memory device.

Referring to FIG. 2, an internal clock generator 20 receives an external clock signal EXCLK and generates an internal clock signal INCLK3. A data output circuit 30 outputs DATA read from a memory core (not shown) to an external device in synchronization with internal clock signal INCLK3, as generated by internal clock generator 20. Internal clock generator 20 includes a variable delay circuit 40, a buffer circuit 50, a replica delay circuit 60, and a phase detector 70. The data output circuit 30 includes an internal output circuit 31 and an output driver 32. Buffer circuit 50 includes a duty correction unit 51 and a clock buffer circuit 52. Clock buffer circuit 52 includes a first buffer unit 53 and a second buffer unit 54.

It is desirable that the replica delay circuit 60 be configured to have a delay that is equal a time period required to output the DATA via data output circuit 30. However, it is difficult to configure replica delay circuit 60 such that the delay provided by replica delay circuit 60 is equal to the delay period associated with data output circuit 30. Thus, the delay provided by replica delay circuit 60 is usually not equal to the delay associated with data output circuit 30. As a result, the internal clock signal INCLK3 generated by internal clock generator 20 is not synchronized with the external clock signal EXCLK even after delay adjustments by a phase-locked or delay-locked circuit. Some phase offset usually remains.

Thus, in a conventional internal clock generator, a buffer circuit providing an additional delay adjustment is used to compensate for the phase offset of an internal clock signal. The composition and operation of this circuit is further illustrated with reference to FIGS. 3A and 3B.

FIG. 3A is a schematic diagram illustrating first buffer unit 53 of FIG. 2 in some additional detail. Similarly, FIG. 3B is a schematic diagram illustrating second buffer unit 54 of FIG. 2 in some additional detail.

Referring to FIG. 3A, first buffer unit 53 includes buffers 81 through 83. Referring to FIG. 3B, second buffer unit 54 includes buffers 91 through 93. Here, buffers 81 through 83 and the buffers 91 through 93 are implemented using substantially identical circuits.

Referring to FIG. 3B, a first plurality of capacitors C1 through C3 is connected in parallel, each with one node connected between the buffers 91 and 92, and a second plurality of capacitors C4 through C6 is connected in parallel, each with one node between the buffers 92 and 93. Capacitors C1 through C3 delay a signal output from buffer 91 for a predetermined time. Capacitors C4 through C6 similarly delay a signal output from buffer 92. Thus, the total delay provided by second buffer unit 54 depends on capacitances of capacitors C1 through C6.

As described above, conventional internal clock generator 20 compensates for the phase offset of internal clock signal INCLK3 by varying the capacitances of the capacitors C1 through C6 in clock buffer circuit 52. However, such a conventional configuration has several problems.

First, in order to provide variable delay adjustments, clock buffer circuit 52 should include variable capacitances. Second, if data output circuit 30 is heavily loaded, then the capacitors used in clock buffer circuit 52 must have large capacitance. Third, since the first and second pluralities of capacitors, C1 through C6, included in the clock buffer circuit 52 can only delay internal clock signal INCLK1, as opposed to accelerating the clock signal, it is difficult to finely adjust the phase offset of internal clock signal INCLK3.

Where the first and second pluralities of capacitors, C1 through C6, are included in the second buffer unit 54 of clock buffer circuit 52, as shown in FIG. 3B, the duty cycle of the internal clock signal INCLK3 output from second buffer unit 54 changes. However, since first buffer unit 53 doesn't similarly include the delaying capacitor structures, the internal clock signal INCLK2 output from first buffer unit 53 and the internal clock signal INCLK3 output from second buffer unit 54 have different duty cycles.

SUMMARY OF THE INVENTION

The present invention provides an amplifier circuit whose output delay depends on a common mode voltage level.

The present invention also provides a replica delay circuit that includes an amplifier circuit having variable output delay and delays or hastens the phase of an internal clock signal, thereby finely compensating for a phase offset of the internal clock signal.

The present invention also provides an internal clock generator that includes a replica delay circuit that compensates for a phase offset of an internal clock signal.

According to one aspect of the present invention, there is provided an amplifier circuit comprising a first amplifier and a second amplifier. The first amplifier outputs internal signals in response to input signals and changes a common mode voltage level of the internal signals in response to control signals and the second amplifier compares voltage levels of the internal signals, outputs an output signal according to a result of comparison, and changes a duty cycle of the output signal when the common mode voltage level of the internal signals is changed.

According to another aspect of the present invention, there is provided a replica delay circuit of an internal clock generator that receives an external clock signal, is locked when a phase difference between the external clock signal and a reference clock signal generated internally falls within a predetermined error range, and outputs an internal clock signal as a result of the locking, the replica delay circuit comprising a first replica delay unit and a second replica delay unit. The first replica delay unit delays the internal clock signal for a predetermined amount of time and outputs first delay clock signals and the second replica delay unit outputs the reference clock signal in response to the first delay clock signals and changes a duty cycle of the reference clock signal in response to control signals.

According to still another aspect of the present invention, there is provided an internal clock generator that receives an external clock signal, is locked when a phase difference between the external clock signal and a reference clock signal generated internally falls within a predetermined error range, and outputs an internal clock signal as a result of the locking, the internal clock generator comprising a variable delay circuit, a buffer circuit, a replica delay circuit, a control signal generator, and a phase detector. The variable delay circuit delays the external clock signal for a first predetermined amount of time and outputs the delayed external clock signal. The buffer circuit amplifies the delayed external clock signal and outputs the internal clock signal. The replica delay circuit delays the internal clock signal for a second predetermined amount of time, outputs the reference clock signal, and changes a duty cycle of the reference clock signal in response to control signals. The control signal generator generates the control signals according to a phase offset between the internal clock signal and the external clock signal. The phase detector detects a phase difference between the external clock signal and the reference clock signal and controls the first predetermined amount of time of the variable delay circuit according to a result of detection.

BRIEF DESCRIPTION OF THE DRAWINGS

The above and other aspects and advantages of the present invention will become more readily apparent from the detailed description of presently embodiment(s) that follows, with reference to the accompanying drawings in which.

DETAILED DESCRIPTION OF THE PREFERRED EMBODIMENT(S)

Figure 1:
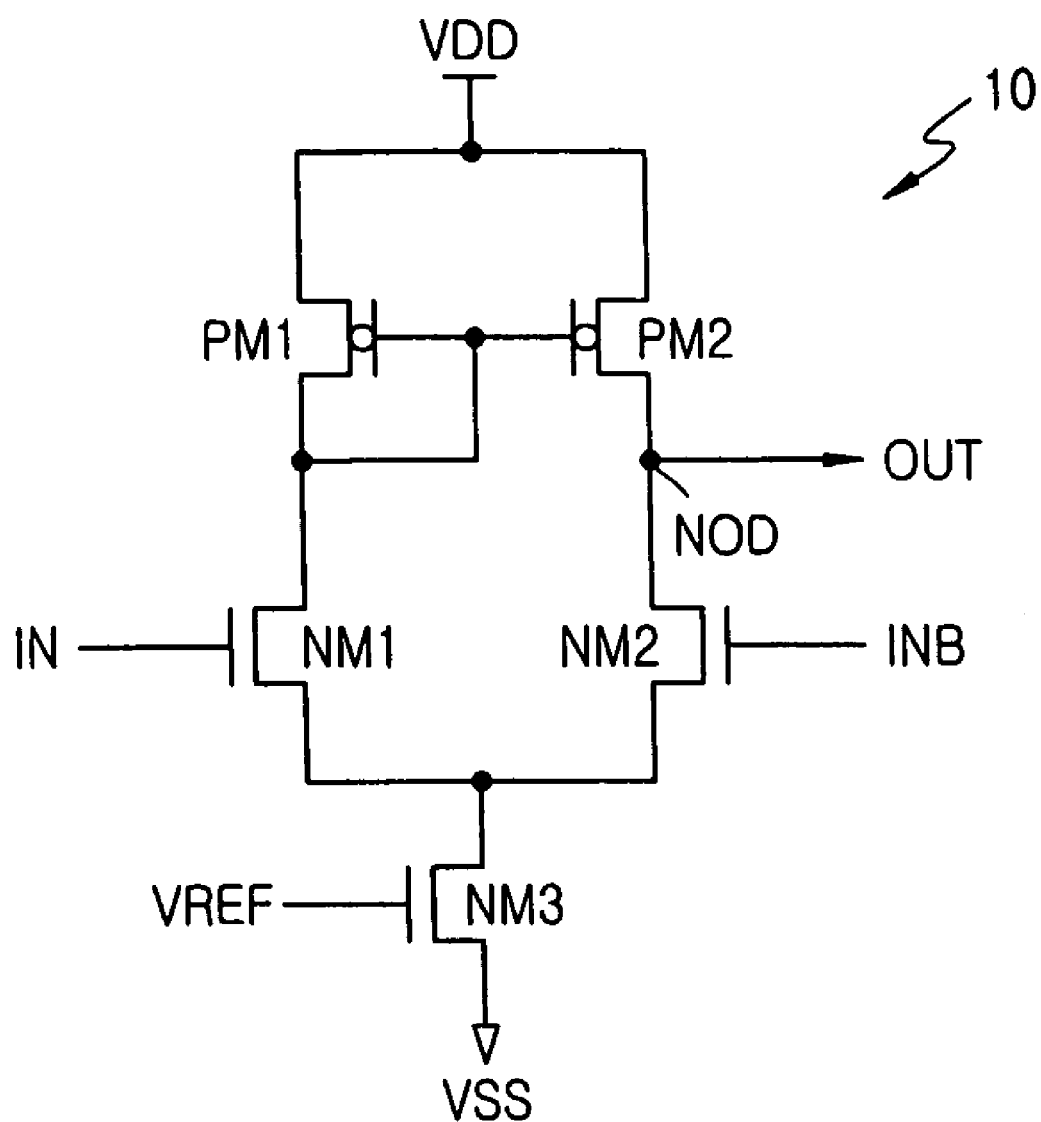
FIG. 1 is a circuit diagram of a conventional differential amplifier.
Figure 2:
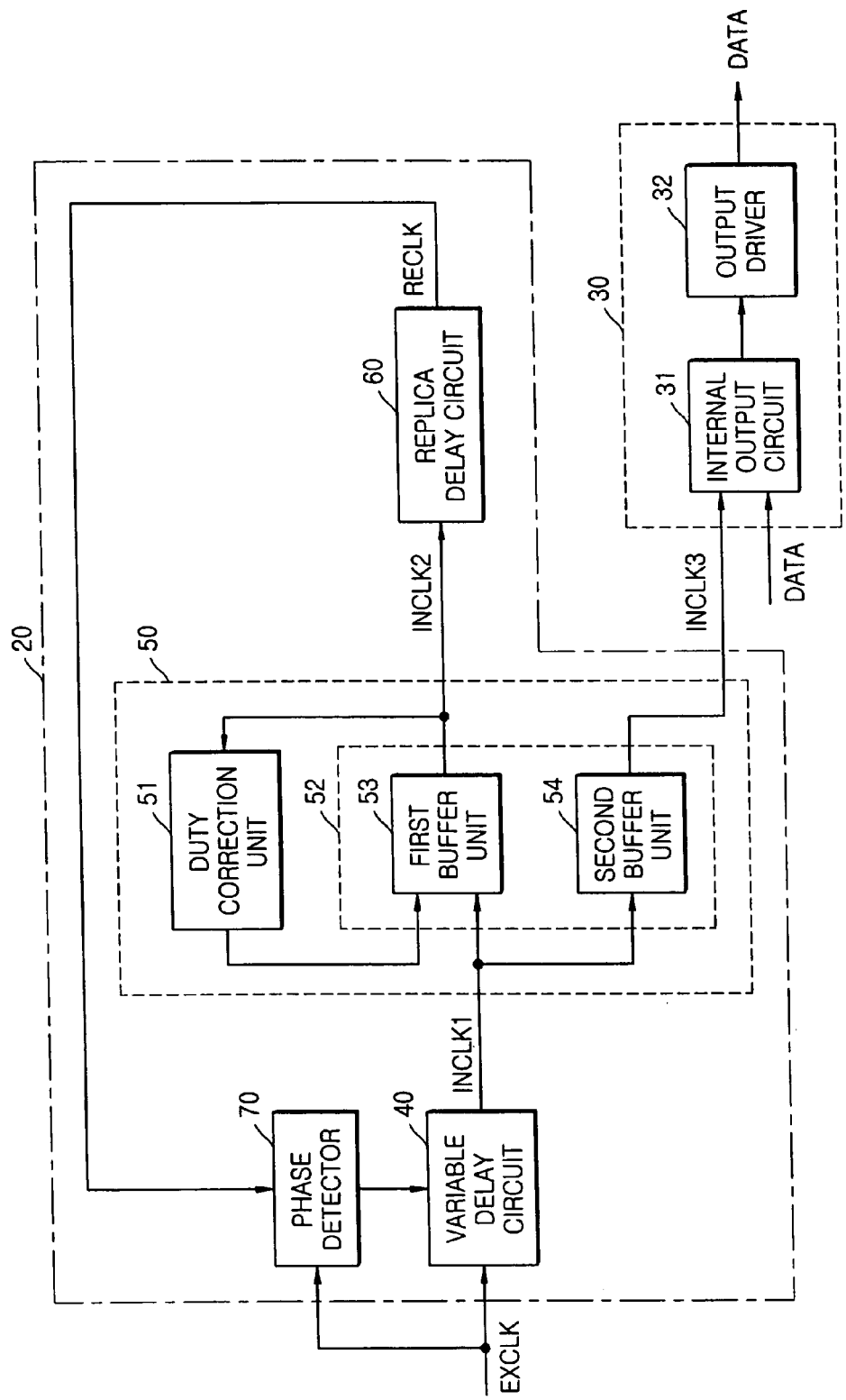
FIG. 2 is a block diagram of a conventional internal clock generator and a data output circuit included in a semiconductor memory device.
Figure 3A:
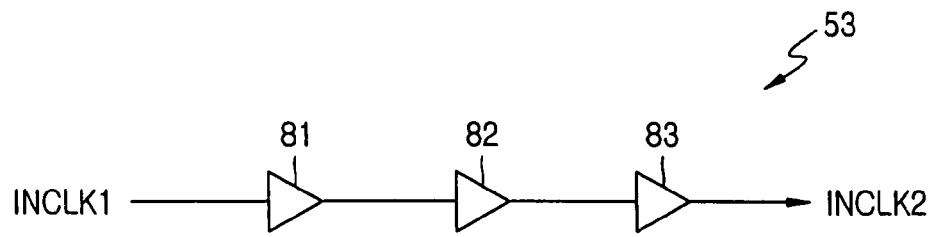
FIG. 3A is a more detailed schematic diagram of a first buffer unit of FIG. 2.
Figure 3B:
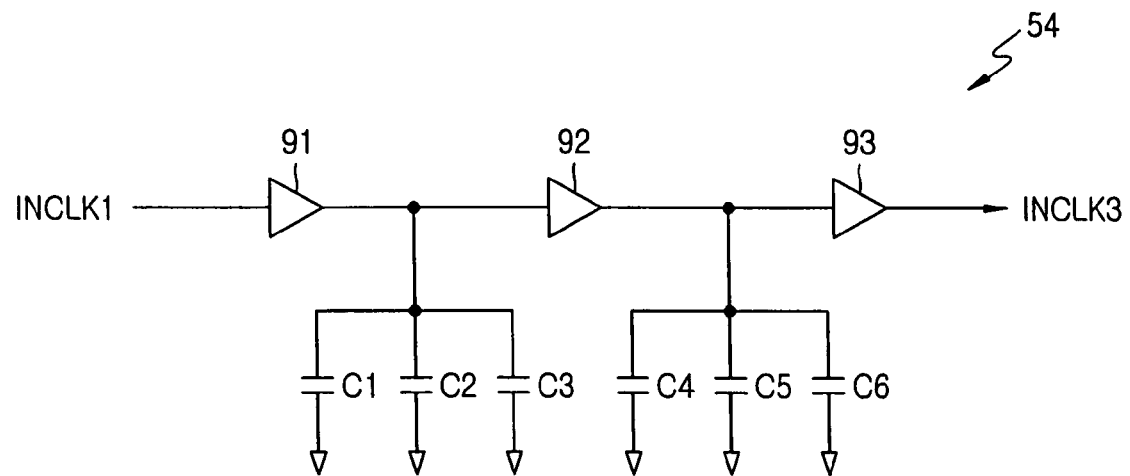
FIG. 3B is a more detailed schematic diagram of a second buffer unit of FIG. 2.

The present invention will now be described more fully with reference to the accompanying drawings, in which an exemplary embodiment of the invention is shown. Throughout the drawings, like reference numerals are used to refer to like elements.

Figure 4:
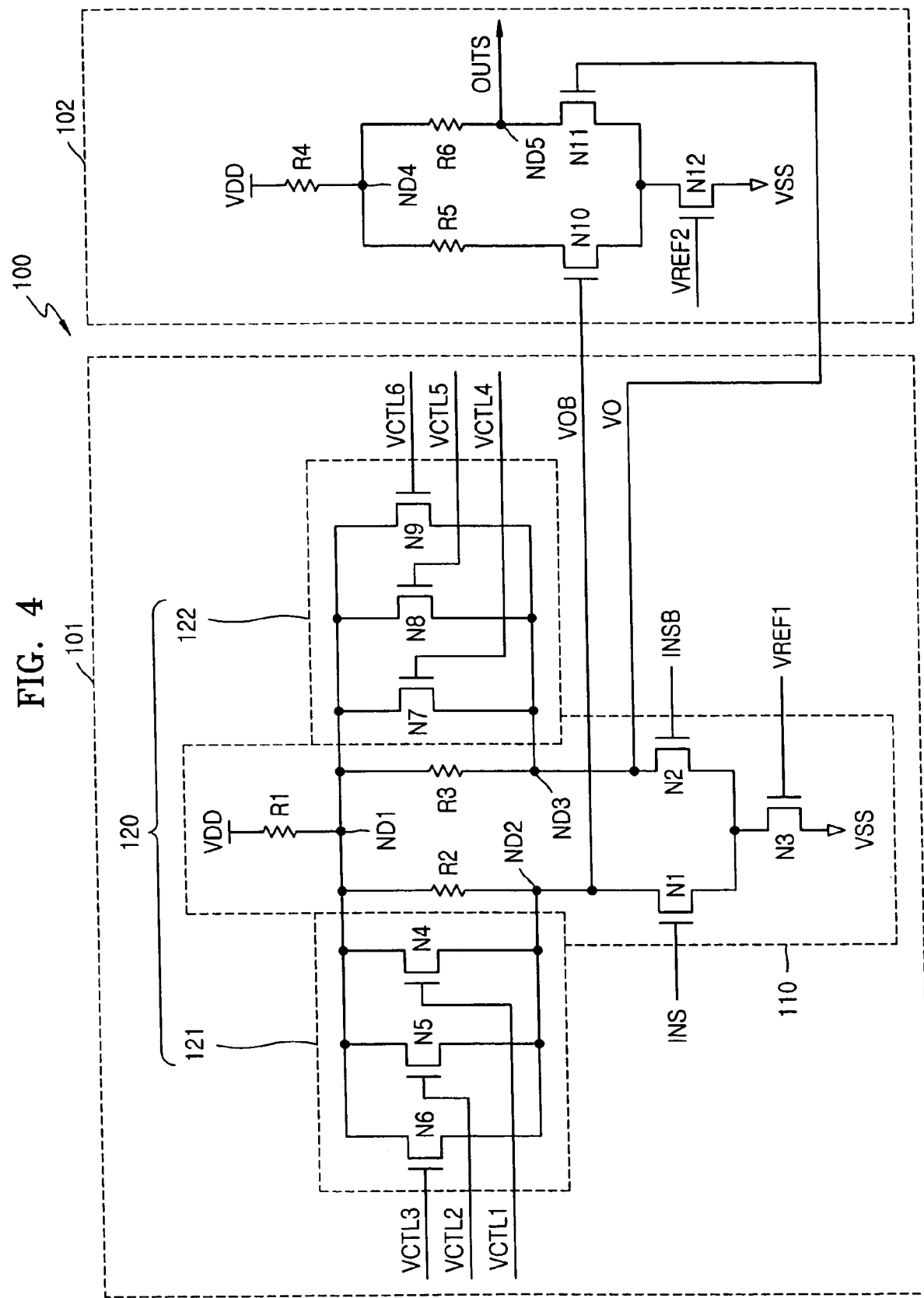
FIG. 4 is a circuit diagram of an amplifier circuit according to an embodiment of the present invention.

FIG. 4 is a circuit diagram of an amplifier circuit 100 according to a preferred embodiment of the present invention.

Referring to FIG. 4, amplifier circuit 100 includes a first amplifier 101 and a second amplifier 102. First amplifier 101 includes, for example, a differential amplifier 110 and a common mode control circuit 120. Differential amplifier 110 compares the voltage levels of input signals INS and INSB and outputs internal signals VO and VOB in accordance with the comparison.

In the illustrated example, differential amplifier 110 includes resistors R1 through R3 and NMOS transistors N1 through N3. Resistor R1 is connected between an internal voltage VDD and a first node ND1, resistor R2 is connected between first node ND1 and a second node ND2, and resistor R3 is connected between first node ND1 and a third node ND3. A drain of NMOS transistor N1 is connected to second node ND2, and the input signal INS is input to a gate of NMOS transistor N1. A drain of NMOS transistor N2 is connected to third node ND3, and the input signal INSB is input to the gate of NMOS transistor N2. Input signal INSB is a complementary signal to input signal INS. The sources of NMOS transistors N1 and N2 are connected to a drain of NMOS transistor N3. A source of NMOS transistor N3 is connected to a ground voltage VSS, and a first reference voltage VREF1 is input to a gate of NMOS transistor N3.

Common mode control circuit 120 changes the voltage levels of internal signals VO and VOB in response to a plurality of control signals VCTL1 through VCTL6. The plurality of control signals VCTL1 through VCTL6 are generated by an external control signal generator (not shown). Common mode control circuit 120 includes a first common mode change circuit 121 and a second common mode change circuit 122. First common mode change circuit 121 includes, for example, NMOS transistors N4 through N6, and second common mode change circuit 122 includes NMOS transistors N7 through N9. The drains of NMOS transistors N4 through N6 are connected to first node ND1, and the sources of NMOS transistors N4 through N6 are connected to second node ND2. Control signals VCTL1 through VCTL3 are respectively input to the gates of NMOS transistors N4 through N6. The drains of NMOS transistors N7 through N9 are also connected to first node ND1, and the sources of NMOS transistors N7 through N9 are connected to third node ND3. Control signals VCTL4 through VCTL6 are respectively input to the gates of NMOS transistors N7 through N9. NMOS transistors N4 through N9 are turned on or off in response to control signals VCTL1 through VCTL6, respectively. In FIG. 4, first common mode change circuit 121 and second common mode change circuit 122 each preferably include three NMOS transistors. However, the number and type of transistors included in each of the first common mode change circuit 121 and the second common mode change circuit 122 may vary.

Second amplifier 102 compares the voltage levels of the input signals VO and VOB received from first amplifier 101, and outputs an output signal OUTS in accordance with the comparison. Second amplifier 102 may be implemented, for example, using a differential amplifier including resistors R4 through R6 and NMOS transistors N10 through N12, as shown in FIG. 4. Resistor R4 is connected between internal voltage VDD and a fourth node ND4. Resistor R5 is connected between fourth node ND4 and a drain of NMOS transistor N10. Resistor R6 is connected between fourth node ND4 and a fifth node ND5. The signal VOB derived from first amplifier 101 is input to a gate of NMOS transistor N10, and the signal VO also derived from first amplifier 101 is input to a gate of NMOS transistor N11. Also, the drain of NMOS transistor N11 is connected to fifth node ND5, and the sources of NMOS transistors N10 and N11 are connected to a drain of NMOS transistor N12. The output signal OUTS is output from fifth node ND5.

A source of NMOS transistor N12 is connected to ground voltage VSS, and a second reference voltage VREF2 is input to a gate of NMOS transistor N12. The first reference voltage VREF1 and the second reference voltage VREF2 may be set to the same or different voltage values.

Figure 5:
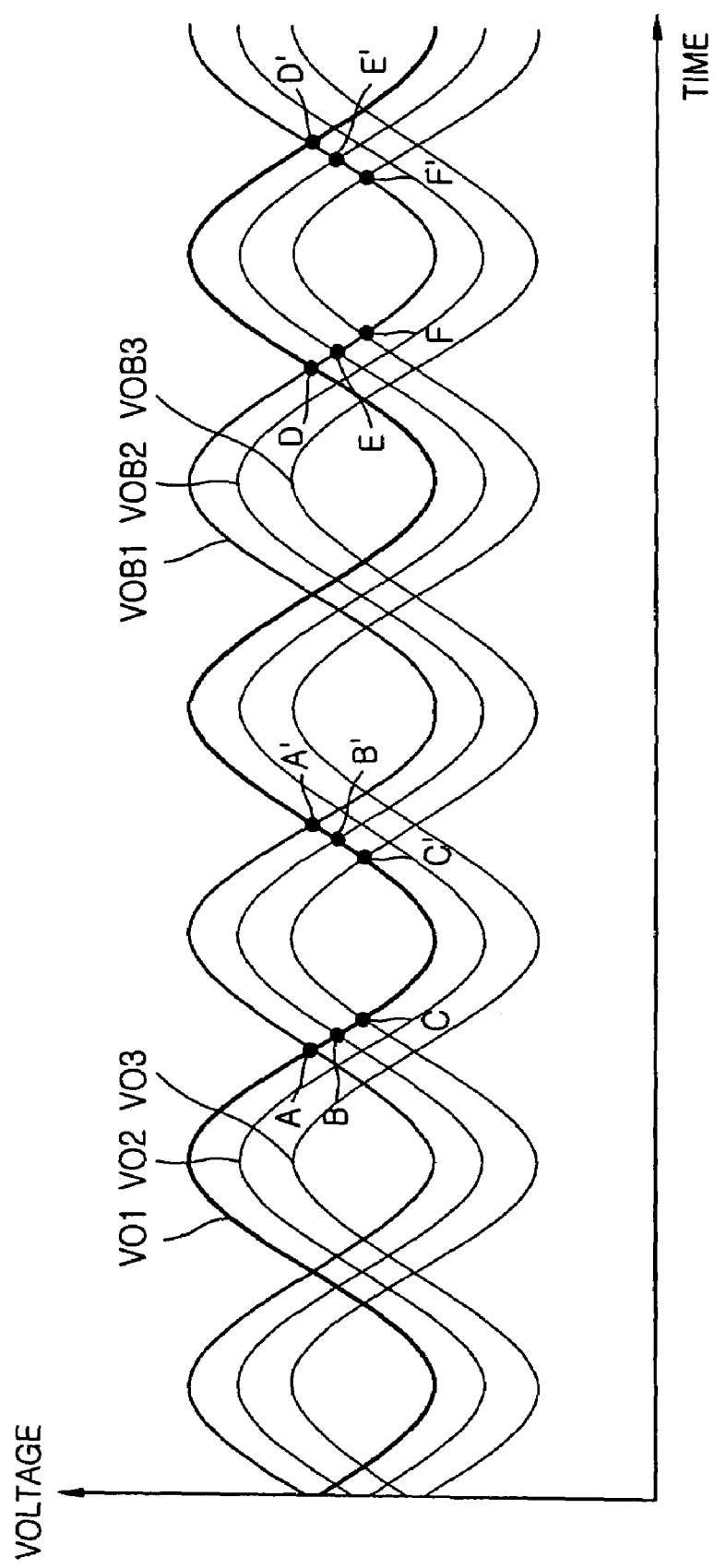
FIG. 5 illustrates waveforms of internal signals output from a first amplifier of FIG. 4.
Figure 6A:
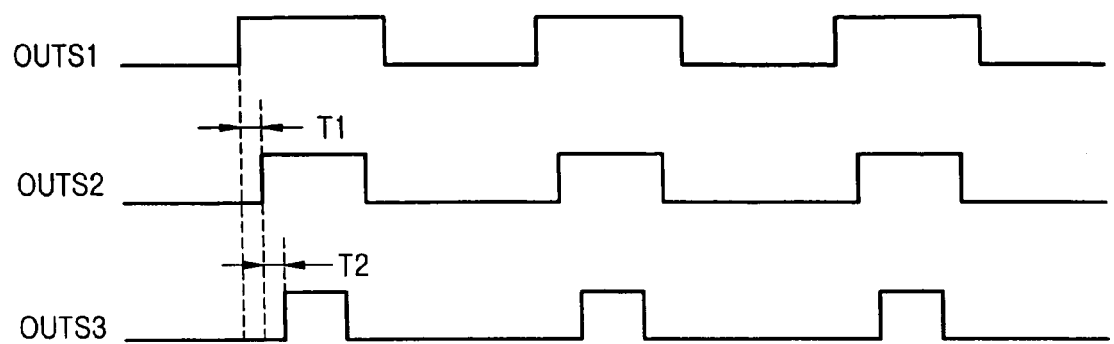
FIGS. 6A and 6B are timing diagrams of an output signal output from a second amplifier of FIG. 4.
Figure 6B:
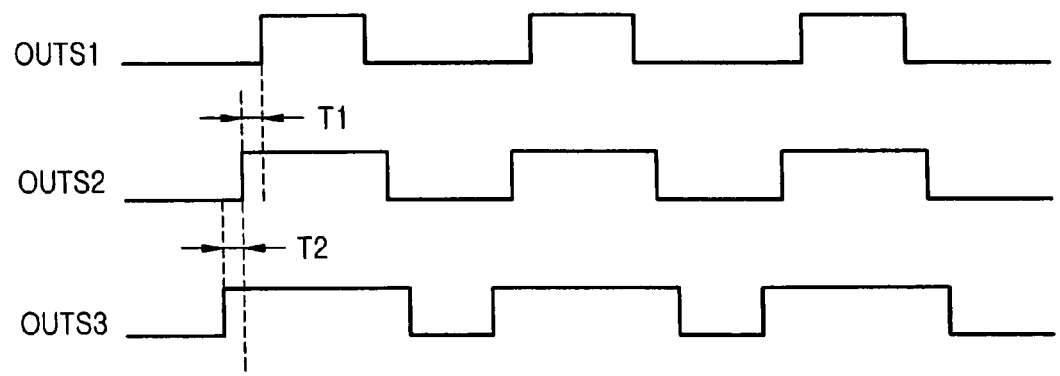

Hereinafter, referring collectively to FIGS. 4, 5, 6A and 6B, the operation of amplifier circuit 100 will be described. FIG. 5 illustrates signal waveforms for internal signals (VO and VOB) output from first amplifier 101 of FIG. 4. FIGS. 6A and 6B are signal timing diagrams for the output signal OUTS output from second amplifier 102 of FIG. 4.

First, it is assumed that all of control signals VCTL4 through VCTL6 are enabled, that some or all of control signals VCTL1 through VCTL3 are disabled, and that the input signals INS and INSB input to differential amplifier 110 are square wave signals.

Under these circumstances, all NMOS transistors N7 through N9 of second common mode change circuit 122 are turned on in response to the control signals VCTL4 through VCTL6. Some or all of NMOS transistors N4 through N6 are turned off in response to control signals VCTL1 through VCTL3. As a result, a resistance between first node ND1 and second node ND2 of differential amplifier 110 increases, and the voltage level of internal signal VOB output at second node ND2 decreases, and the voltage level of internal signal VO output at third node ND3 remains constant. Referring to FIG. 5, VOB1 represents an internal signal that is output at second node ND2 when NMOS transistors N4 through N6 are all turned on VOB2 and VOB3 represent internal signals output at second node ND2 when some or all of NMOS transistors N4 through N6 are turned off, respectively.

When the voltage level of internal signal VO remains constant and the voltage level of internal signal VOB gradually decreases from VOB1 to VOB2 to VOB3, a common mode voltage level gradually decreases from M' to BB' to CC'. A common mode voltage is a voltage at which internal signals VO and VOB coincide.

Second amplifier 102 outputs the output signal OUTS in response to internal signals VO and VOB. Second amplifier 102 outputs the output signal OUTS at a high level when the voltage level of internal signal VOB is higher than that of internal signal VO, and outputs the output signal OUTS at a low level when the voltage level of internal signal VOB is lower than that of internal signal VO.

Referring to FIG. 6A, an output signal OUTS1 is output from second amplifier 102 when second amplifier 102 receives internal signals VO and VOB1 that having common mode voltage level M', an output signal OUTS2 is output from second amplifier 102 when second amplifier 102 receives internal signals VO1 and VOB2 having common mode voltage level BB', and an output signal OUTS3 is output from second amplifier 102 when second amplifier 102 receives internal signals VO1 and VOB3 having common mode voltage level CC'.

As shown in FIG. 6A, as the common mode voltage level of the internal signals VO and VOB input to second amplifier 102 decreases, the duty cycle of the output signal OUTS changes. In other words, activated (or "on") periods for output signals OUTS2 and OUTS3 are shorter than an activated period for output signal OUTS1. This is the case because AA' has a greater period than BB' or CC' during which the voltage level of internal signal VOB is larger than the voltage level of internal signal VO. Thus, a rising edge of output signal OUTS2 occurs a time T1 after a rising edge of output signal OUTS1. Likewise, a rising edge of output signal OUTS3 occurs a time T2 after the rising edge of output signal OUTS2.

Next, it is assumed that control signals VCTL1 through VCTL3 all are enabled and that some or all of control signals VCTL4 through VCTL6 are disabled.

Under these circumstances, all NMOS transistors N4 through N6 in first common mode change circuit 121 are turned on in response to control signals VCTL1 through VCTL3. Some or all of NMOS transistors N7 through N9 are turned off in response to control signals VCTL4 through VCTL6. As a result, a resistance between first node ND1 and third node ND3 of differential amplifier 110 increases and the voltage level of internal signal VO output at third node ND3 decreases, and the voltage level of internal signal VOB output at second node ND2 remains constant. Referring to FIG. 5, VO1 represents an internal signal output at third node ND3 when NMOS transistors N7 through N9 are all turned on VO2 and VO3 represent internal signals output from third node ND3 when some or all of NMOS transistors N7 through N9 are turned off, respectively.

When the voltage level of internal signal VOB remains constant and the voltage level of internal signal VO gradually decreases from VO1 to VO2 to VO3, the common mode voltage level gradually decreases from DD' to EE' to FF'. Second amplifier 102 outputs the output signal OUTS in response to internal signals VO and VOB. Referring to FIG. 6B, an output signal OUTS1 is output from second amplifier 102 when second amplifier 102 receives internal signals VO1 and VOB1 having a common mode voltage level DD'. An output signal OUTS2 is output from second amplifier 102 when second amplifier 102 receives internal signals VO2 and VOB1 having a common mode voltage level EE'. An output signal OUTS3 is output from second amplifier 102 when second amplifier 102 receives internal signals VO3 and VOB1 having a common mode voltage level FF'.

As shown in FIG. 6B, as the common mode voltage level of the internal signals VO and VOB input to second amplifier 102 decrease, the duty cycle of the output signal OUTS changes. In other words, activated (or "on") periods for output signals OUTS2 and OUTS3 are longer than the activated period of output signal OUTS1. Thus, a rising edge of output signal OUTS2 occurs a time TI before a rising edge of output signal OUTS1. Likewise, a rising edge of output signal OUTS3 occurs a time T2 before the rising edge of output signal OUTS2.

As described above, amplifier circuit 100 changes the duty cycle of the output signal OUTS as the common mode voltage level changes. As a result, it is possible to delay or accelerate the phase of the output signal OUTS.

Figure 7:
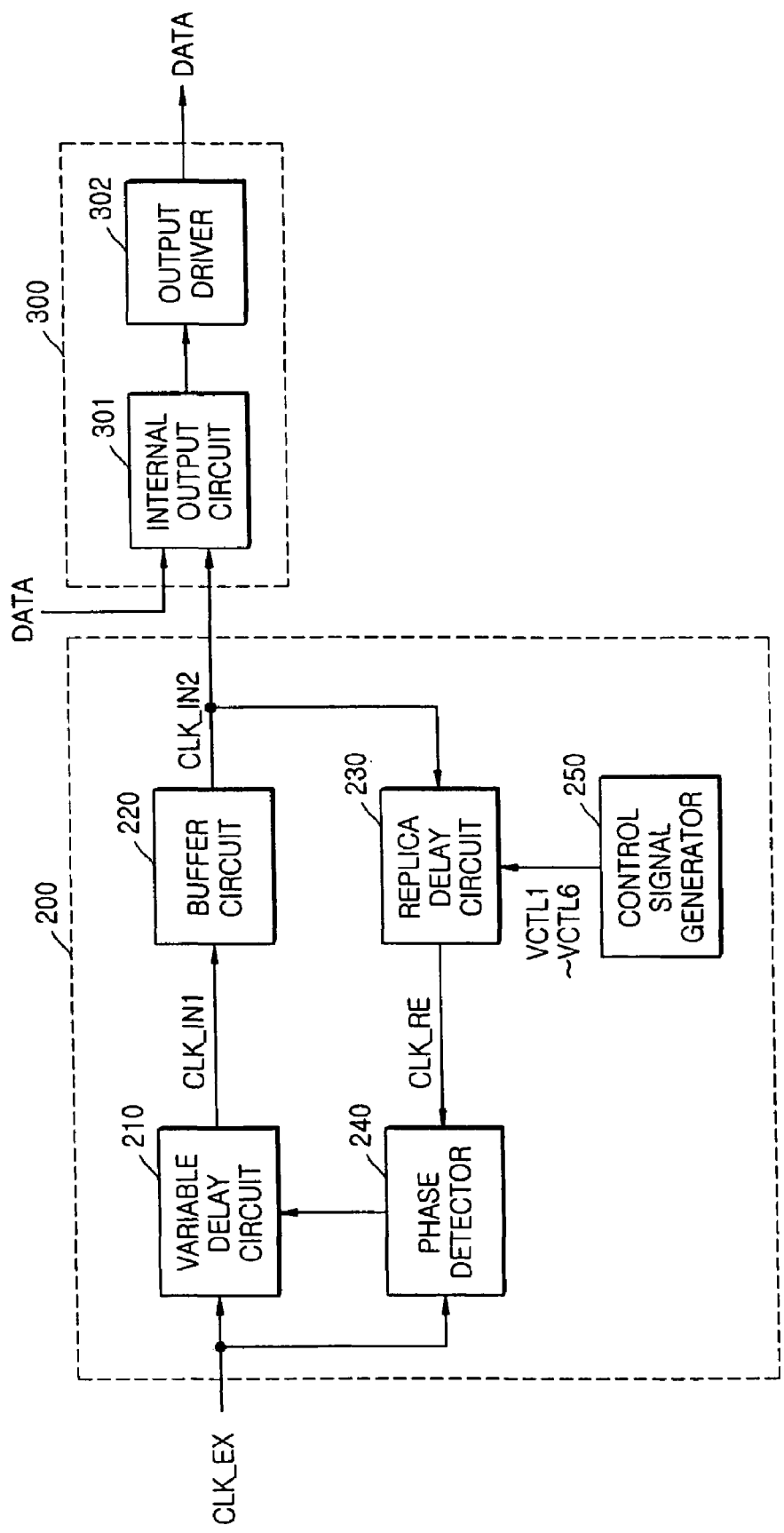
FIG. 7 is a block diagram of an internal clock generator according to an embodiment of the present invention and a data output circuit included in a semiconductor memory device.

FIG. 7 is a block diagram of an internal clock generator 200 according to another embodiment of the present invention and a data output circuit 300 included in a semiconductor memory device. Internal clock generator 200 may be implemented using a DLL or a PLL circuit, but the internal clock generator 200 shown in the illustrated example is implemented using a DLL for convenience of explanation.

Referring to FIG. 7, internal clock generator 200 includes a variable delay circuit 210, a buffer circuit 220, a replica delay circuit 230, a phase detector 240, and a control signal generator 250. Variable delay circuit 210 delays an external clock signal CLK_EX for a first predetermined amount of time and outputs a first internal clock signal CLK_IN1. Buffer circuit 220 amplifies the first internal clock signal CLK_IN1 and outputs a second internal clock signal CLK_IN2.

Replica delay circuit 230 is configured to have a delay similar to that of data output circuit 300 to compensate for the amount of time required to read DATA from a memory core and be output to an external device through data output circuit 300. Replica delay circuit 230 receives second internal clock signal CLK_IN2 and outputs a reference clock signal CLK_RE in response to control signals VCTL1 through VCTL6. Replica delay circuit 230 is further described in some additional detail with reference to FIG. 8, as described hereafter.

Returning to FIG. 7, phase detector 240 detects a phase difference between the reference clock signal CLK_RE and the external clock signal CLK_EX and changes a first predetermined delay period in accordance with the detection result, thereby controlling the delay of variable delay circuit 210.

Control signal generator 250 outputs control signals VCTL1 through VCTL6 to replica delay circuit 230 in response to a predetermined input signal (not shown) input from an external device. Control signal generator 250 may be implemented using a fuse circuit or a mode register set (MRS). The fuse circuit and/or the MRS are conventional in nature and readily implemented by those skilled in the art. Therefore, the configuration and operation of control signal generator 250 will not be described here.

Internal clock generator 200 is locked (synchronized) when the phase difference between external clock signal CLK_EX and reference clock signal CLK_RE falls within a predetermined error range. As a result of the this synchronization, internal clock generator 200 outputs the second internal clock signal CLK_IN2 at a fixed frequency.

Data output circuit 300 receives the DATA and outputs it to an external device in synchronization with second internal clock signal CLK_IN2. Data output circuit 300 preferably includes an internal output circuit 301 and an output driver 302.

Figure 8:
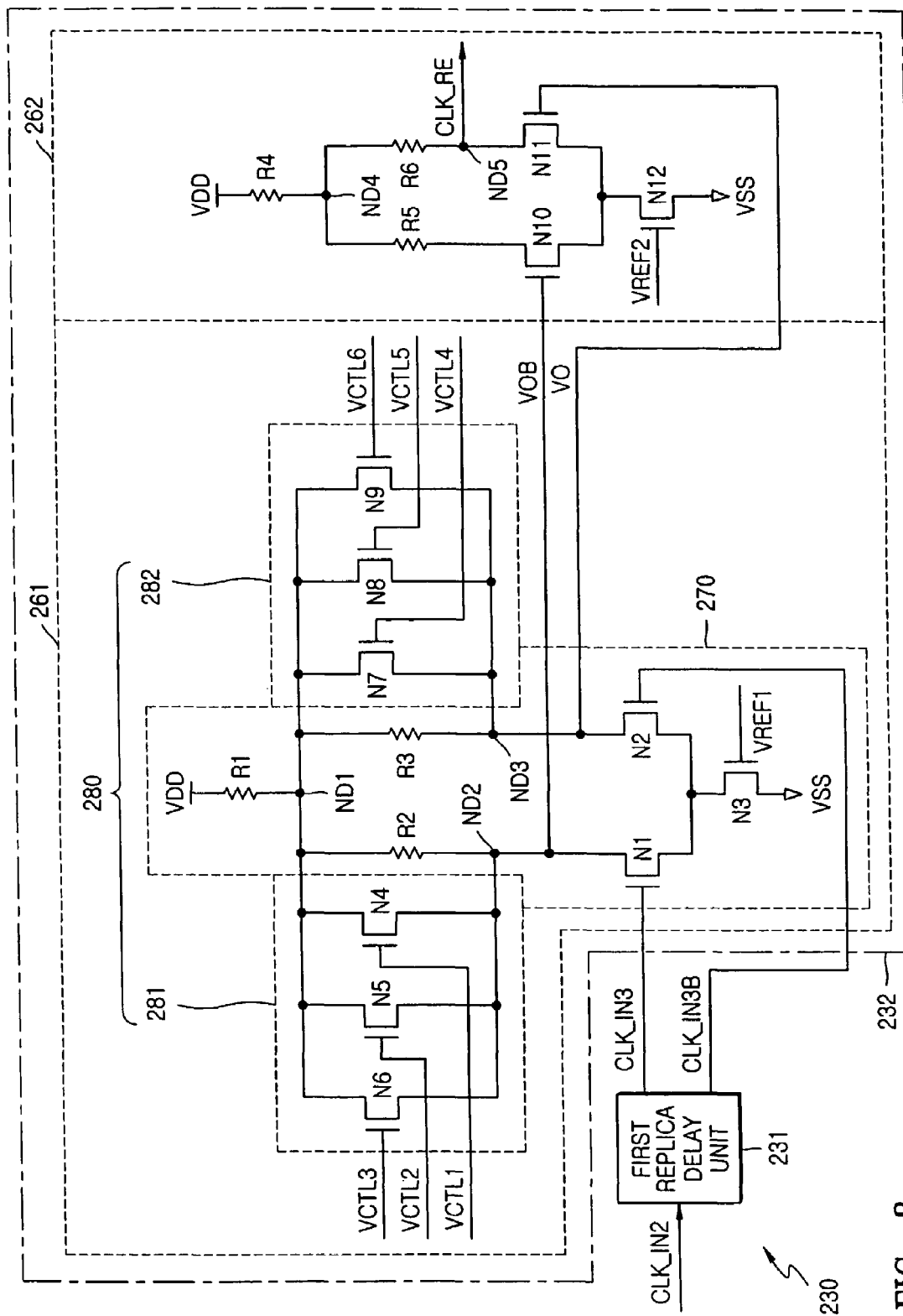
FIG. 8 is a more detailed view of a replica delay circuit of FIG. 7.

FIG. 8 is a more detailed view of the replica delay circuit 230 shown in FIG. 7.

Referring to FIG. 8, replica delay circuit 230 includes a first replica delay unit 231 and a second replica delay unit 232. First replica delay unit 231 is configured to provide a delay that is substantially the same as that provided by the internal output circuit 301 of data output circuit 300. First replica delay unit 231 delays a second internal clock signal CLK_IN2 received from buffer circuit 220 for a second predetermined period of time and outputs a third internal clock signal CLK_IN3 and an inverted third internal clock signal CLK_IN3B that is complementary to third internal clock signal CLK_IN3.

Second replica delay unit 232 is configured to provide a delay that is substantially the same as the delay provided by the output driver 302 of data output circuit 300. Second replica delay unit 232 receives third internal clock signal CLK_IN3 and inverted third internal clock signal CLK_IN3B and outputs reference clock signal CLK_RE in response to control signals VCTL1 through VCTL6. Second replica delay unit 232 includes a first amplifier 261 and a second amplifier 262.

First amplifier 261 receives third internal clock signal CLK_IN3 and inverted third internal clock signal CLK_IN3B and outputs internal signals VO and VOB that have a predetermined common mode voltage level determined by control signals VCTL1 through VCTL6. The configuration and operation of first amplifier 261 are substantially the same as those previously described in relation to first amplifier 101 of FIG. 4.

Second amplifier 262 outputs reference clock signal CLK_RE in response to internal signals VO and VOB. That is, second amplifier 262 changes the duty cycle of reference clock signal CLK_RE when the common mode voltage level of the internal signals VO and VOB is changed and then outputs the reference clock signal CLK_RE with the changed duty cycle. The configuration and operation of the second amplifier 262 are substantially the same as those previously described in relation to second amplifier 102 of FIG. 4.

The operation of internal clock generator 200 will now be described with reference to FIGS. 7 and 8.

Phase detector 240 detects a phase difference between external clock signal CLK_EX and reference clock signal CLK_RE and defines the delay of variable delay circuit 210 in accordance with the result of the detection. Variable delay circuit 210 receives external clock signal CLK_EX, delays it for a first predetermined period of time, and outputs the delayed external clock signal CLK_EX as first internal clock signal CLK_IN 1. Buffer circuit 220 amplifies the first internal clock signal CLK_IN 1 and outputs the amplified first internal clock signal CLK_IN1 as second internal clock signal CLK_IN2.

Replica delay circuit 230 delays second internal clock signal CLK_IN2 and outputs reference clock signal CLK_RE. Here, replica delay circuit 230 delays second internal clock signal CLK_IN2 by a delay period equal to the amount of time required to read DATA from the memory core and output the DATA to an external device via data output circuit 300. More specifically, first replica delay unit 231 of replica delay circuit 230 delays second internal clock signal CLK_IN2 for a second predetermined period of time and outputs third internal clock signal CLK_IN3 and the inverted third internal clock signal CLK_IN3B.

Second replica delay unit 232 of replica delay circuit 230 receives third internal clock signal CLK_IN3 and inverted third internal clock signal CLK_IN3B and outputs reference clock signal CLK_RE.

To control a phase offset of second internal clock signal CLK_IN2, control signal generator 250 outputs control signals VCTL1 through VCTL6. For example, when the phase of the second internal clock signal CLK_IN2 should be delayed, control signal generator 250 disables some or all of control signals VCTL1 through VCTL3 and enables all of control signals VCTL4 through VCTL6. As a result, as indicated by BB' or CC' in FIG. 5, the common mode voltage level of the internal signals VO and VOB output from first amplifier 261 of second replica delay unit 232 decreases. The second amplifier 262 of second replica delay unit 232 outputs reference clock signal CLK_RE with a duty cycle in which activated periods are shorter than deactivated periods, similar to the output signal OUTS2 or OUTS3 of FIG. 6A, in response to internal signals VO and VOB. Thus, it is possible to obtain an effect similar to delaying the phase of the reference clock signal CLK_RE.

Phase detector 240 detects the phase difference between a reference clock signal CLK_RE having a changed duty cycle and external clock signal CLK_EX, and changes a first predetermined period of time in accordance with the detection result, thereby controlling the delay of variable delay circuit 210. Thereafter, internal clock generator 200 conducts synchronization again.

On the other hand, if the phase of second internal clock signal CLK_IN2 should be accelerated, control signal generator 250 disables some or all of control signals VCTL4 through VCTL6 and enables all of control signals VCTL1 through VCTL3. As a result, as indicated by EE' or FF' in FIG. 5, the common mode voltage level of input signals VO and VOB output from the first amplifier 261 of second replica delay unit 232 decreases. The second amplifier 262 of second replica delay unit 232 outputs reference clock signal CLK_RE with a duty cycle in which deactivated periods are shorter than activated periods, similar to the output signal OUTS2 or OUTS3 of FIG. 6B, in response to internal signals VO and VOB. Thus, it is possible to obtain an effect similar to accelerating the phase of reference clock signal CLK_RE.

Phase detector 240 detects the phase difference between a reference clock signal CLK_RE having a changed duty cycle and the external clock signal CLK_EX, and changes the first predetermined period of time in accordance with the detection result, thereby controlling the delay of variable delay circuit 210. Thereafter, the internal clock generator 200 conducts synchronization again.

Since phase detector 240 detects the phase difference between external clock signal CLK_EX and reference clock signal CLK_RE by comparing only the rising or falling edges of the external clock signal CLK_EX and the reference clock signal CK_RE, it is not affected by a change in the duty cycle of the reference clock signal CLK_RE.

In other words, phase detector 240 compares the phase of reference clock signal CLK_RE, whose rising edge or falling edge is delayed or accelerated by a change in duty cycle, with respect to the phase of external clock signal CLK_EX.

As described above, since the replica delay circuit 230 according to the present invention is implemented using an amplifier circuit whose output delay is changed in accordance with a common mode voltage level, it is possible to delay or accelerate the relative phase of an internal clock signal.

Since internal clock generator 200 according to the present invention generates an internal clock signal based on a reference clock signal whose phase is delayed or accelerated using a replica delay circuit, it is possible to compensate for a phase offset in the internal clock signal. Also, since internal clock generator 200 according to the present invention compensates for the phase offset of the internal clock signal using the replica delay circuit, it is not necessary for a buffer circuit to include a phase offset compensation circuit, including, for example one or more pluralities of capacitors.

Thus, the amplifier circuit according to the present invention can selectively delay or accelerate the relative phase of an output signal.

The replica delay circuit according to the present invention can delay or accelerate the relative phase of an internal clock signal to compensate for a phase offset in the internal clock signal.

The internal clock generator according to the present invention can precisely compensate for a phase offset in the internal clock signal using the replica delay circuit.

While the present invention has been described herein with reference to several presenting preferred, exemplary embodiments, it will be understood by those of ordinary skill in the art that various changes, adaptations, and modification may be made to the foregoing examples without departing from the scope of the invention as defined by the appended claims and their equivalents.

What is claimed is:

1. A replica delay circuit configured for use in an internal clock generator, the replica delay circuit receiving an external clock signal and outputting an internal clock, and comprising:
    a circuit configured to synchronize a phase difference between the external clock signal and a reference clock signal, wherein the internal clock signal is derived in relation to the phases difference;
    a first replica delay unit, delaying the internal clock signal for a predetermined period of time and generating first delay clock signals; and
    a second replica delay unit, generating the reference clock signal in response to the first delay clock signals and changing a duty cycle of the reference clock signal in response to selected control signals,
    wherein the second replica delay unit comprises:
    a first amplifier generating second delay clock signals in response to the first delay clock signals and changing a common mode voltage level for the second delay clock signals in response to the selected control signals; and
    a second amplifier, comparing voltage levels for the second delay clock signals, outputting the reference clock signal in accordance with a comparison result, and changing the duty cycle of the reference clock signal in accordance with changes in the common mode voltage level of the second delay clock signals.

2. The replica delay circuit of claim 1, wherein the first amplifier further comprises:
    a differential amplifier, comprising a load circuit, and comparing voltage levels for the first delay clock signals, and generating the second delay clock signals in accordance with a comparison result; and
    a common mode control circuit, connected in parallel with the load circuit and changing the common mode voltage level of the second delay clock signals in response to selected control signals.

3. The replica delay circuit of claim 2, wherein the load circuit further comprises a first load connected between a first node and a second node and a second load connected between the first node and a third node, and wherein the common mode control circuit further comprises:

a first common mode change circuit, connected in parallel with the first load and changing a resistance between the first node and the second node in response to first control signals among the selected control signals; and a second common mode change circuit, connected in parallel with the second load and changing a resistance between the second node and the third node in response to second control signals among the selected control signals.

4. The replica delay circuit of claim 3, wherein the first common mode change circuit further comprises:

a plurality of first NMOS transistors having drains connected to the first load, sources connected to the second node, and gates respectively receiving selected first control signals, and;

wherein the second common mode change circuit comprises a plurality of second NMOS transistors have drains connected to the first node, sources connected to the third node, and gates respectively receiving selected second control signals.

5. The replica delay circuit of claim 4, wherein the second delay clock signals include a first clock signal and a second clock signal complementary to the first clock signal, such that upon enabling selected first control signals, at least one of the plurality of first NMOS transistors is turned on, and upon enabling selected second control signals, at least one of the plurality of second NMOS transistors is turned on, such that as the number of transistors turned off in the plurality of first NMOS transistors increases, a voltage level of the second clock signal decreases, and as the number of transistors turned off in the plurality of second NMOS transistors increases, a voltage level of the first clock signal decreases.

6. The replica delay circuit of claim 5, wherein as the voltage level of the second clock signal decreases, a duty cycle of the reference clock signal decreases and as the voltage level of the first clock signal decreases, the duty cycle of the reference clock signal increases.

7. An internal clock generator receiving an external clock signal and generating an internal clock signal in relation to a phase difference determined in relation to a phase/delay lock comparison between the external clock signal and an internally generated reference clock signal, the internal clock generator comprising:

a variable delay circuit delaying the external clock signal for a first predetermined period of time and generating a delayed external clock signal;

a buffer circuit amplifying the delayed external clock signal and generating the internal clock signal;

a replica delay circuit delaying the internal clock signal for a second predetermined period of time, generating the reference clock signal, and changing a duty cycle of the reference clock signal in response to control signals;

a control signal generator generating the control signals in accordance with a phase offset between the internal clock signal and the external clock signal; and a phase detector detecting a phase difference between the external clock signal and the reference clock signal and controlling the first predetermined amount of time of the variable delay circuit in accordance with a detection result, wherein the replica delay circuit comprises:

a first replica delay unit delaying the internal clock signal for a third predetermined period of time and generating first delay clock signals; and a second replica delay unit generating the reference clock signal in response to the first delay clock signals and changing a duty cycle of the reference clock signal in response to control signals.

8. The internal clock generator of claim 7, wherein the second replica delay unit further comprises:

a first amplifier generating second delay clock signals in response to the first delay clock signals and changing a common mode voltage level for the second delay clock signals in response to the control signals; and a second amplifier comparing voltage levels of the second delay clock signals, generating the reference clock signal in accordance with a comparison result, and changing the duty cycle of the reference clock signal as the common mode voltage level of the second delay clock signals is changed.

9. The internal clock generator of claim 8, wherein the first amplifier further comprises:

a differential amplifier, comprising a load circuit, comparing voltage levels of the first delay clock signals, and generating the second delay clock signals in accordance with a comparison result; and a common mode control circuit, connected in parallel with the load circuit and changing the common mode voltage level of the second delay clock signals in response to the control signals.

10. The internal clock generator of claim 9, wherein the load circuit comprises a first load connected between a first node and a second node and a second load connected between the first node and a third node, and the common mode control circuit further comprises:

a first common mode change circuit, connected in parallel with the first load and changing a resistance between the first node and the second node in response to first control signals among the control signals; and a second common mode change circuit, connected in parallel with the second load and changing a resistance between the first node and the third node in response to second control signals among the control signals.

11. The internal clock generator of claim 10, wherein the first common mode change circuit comprises a plurality of first NMOS transistors having drains connected to the first node, sources connected to the second node, and gates respectively receiving selected first control signals, and wherein the second common mode change circuit comprises a plurality of second NMOS transistors have drains connected to the first node, sources connected to the third node, and gates respectively receiving selected second control signals.

12. The internal clock generator of claim 11, wherein the second delay clock signals comprises a first clock signal and a second clock signal complementary to the first clock signal, wherein as at least one of the first control signals is enabled, at least one of the plurality of first NMOS transistors is turned on, and as at least one of the second control signals is enabled, at least one of the plurality of second NMOS transistors is turned on, such that as the number of transistors turned on in the plurality of first NMOS transistors increases, a voltage level of the second clock signal decreases, and as the number transistors turned off in the plurality of the second NMOS transistors increases, a voltage level of the first clock signal decreases.

13. The internal clock generator of claim 12, wherein as the voltage level of the second clock signal decreases, a duty cycle of the reference clock signal correspondingly decreases, and as the voltage level of the first clock signal decreases, the duty cycle of the reference clock signal correspondingly increases.

* * * * *